United States Patent [19]

O'Sullivan et al.

[11] Patent Number: 4,529,927
[45] Date of Patent: Jul. 16, 1985

[54] APPARATUS FOR THE CONTROL OF A SWITCHED POWER REGULATOR

[75] Inventors: Dermot O'Sullivan, Leiderdorp; Jan Schreuders, Katwijk, both of Netherlands

[73] Assignee: Agence Spatiale Europeenne, Paris, France

[21] Appl. No.: 540,205

[22] Filed: Oct. 7, 1983

[51] Int. Cl.³ ............................................. G05F 1/613
[52] U.S. Cl. ..................................... 323/222; 323/285
[58] Field of Search ................ 307/52, 125, 130, 131; 323/222, 282, 284, 285, 299

[56] References Cited

U.S. PATENT DOCUMENTS

| | | | |
|---|---|---|---|
| 4,253,055 | 2/1981 | Gatten | 323/284 |
| 4,255,699 | 3/1981 | Calvin | 307/125 X |
| 4,316,136 | 2/1982 | Saxarra et al. | 323/282 |
| 4,422,138 | 12/1983 | Kornrumpf | 323/222 X |

*Primary Examiner*—A. D. Pellinen
*Assistant Examiner*—Derek S. Jennings
*Attorney, Agent, or Firm*—McCormick, Paulding & Huber

[57] ABSTRACT

A controller apparatus comprising a phase-locked loop circuit which includes a phase comparator and a low-pass filter connected to accept a signal representing the switching frequency of the apparatus and an external frequency signal to produce a control signal for a controllable switch serving to vary the threshold levels of a reference signal, said control signal being a function of the phase difference between the input signals. The hysteresis of the apparatus is thereby changed over a few synchronization cycles in order to pull the controller into synchronization.

2 Claims, 4 Drawing Figures

APPARATUS FOR THE CONTROL OF A SWITCHED POWER REGULATOR

BACKGROUND OF THE INVENTION

The present invention relates to an apparatus for controlling a switched power regulator, which allows the maximum and minimum control levels of current to be controlled by a command signal.

Traditionally, power regulators have employed either classical pulse-width modulation or hysteresis voltage control techniques resulting in power stages which incorporate a second order filter network with the resultant stability and dynamic response problems associated with a basic transfer function incorporating an inherent 180° phase shift. Furthermore, these conventional approaches have a further drawback in that each power stage possesses a voltage gain characteristic; thus paralleling of these stages is difficult since paralleling of voltage generators does not guarantee power sharing between modules without the incorporation of additional power control loops with the inherent complexity and failure modes of these additional circuits.

The above major drawbacks have been eliminated with the advent of limit-cycle conductance controller apparatus and control technique involving the direct control of current in the inductor of the power modules (see D. O'Sullivan and A. Weinberg $LC^3$:Applications in Power Switching and Protection. Proceedings of the Third ESTEC Power Conditioning Seminar, 1977, ESA-SP-126, pages 175–186). This new generation of power controller apparatus results in a first order transfer function and in the current in each power module being directly controlled by the control signal, thereby allowing simple paralleling of several power modules with power sharing if the same control signal is applied to each controller apparatus. A further advantage of these new controllers is that current limiting and device protection is inherent in the control principle.

A limit-cycle conductance controller apparatus known in the art comprises a detector incorporating two switching or hysteresis levels which are varied as a function of the control signal and compared to the sensed inductor current. This type of controller results in a switch oscillation such that the inductor current limit cycles between the two controlled limit levels which can be set by the control signal. This controller produces a controlled average inductor current directly proportional to the control signal with a switching frequency dependent on the difference between the limit levels and the inductor voltage, and thus the frequency is in principle free-running to satisfy the control function.

Also known in the art is a synchronized limit cycle conductance controller in which the two current hysteresis levels are varied as a function of the command signal and compared to the sensed inductor current and in which means are provided to allow an external synchronizing signal to be coupled, thereby to override one of the hysteresis levels. This type of controller is capable of either free-running or fixed frequency operation without modifying any components. Hence, fixed-frequency multiphase operation is possible with the inherent filtering reduction. In the event of failure of the multiphase synchronization signal source, the controller reverts to the free-running mode of operation and thus maintains the essential control operation, although with a slight increase in conducted ripple. A disadvantage of this type of controller, however, is that it needs to be synchronized by real-time signals and consequently it cannot operate in a stable manner for duty cycles from zero to 100%.

The problem to be solved is to allow limit-cycle conductance controllers to operate in a stable manner for duty cycles from zero to 100% with continuation of operation in case the external synchronizing signal is removed.

SUMMARY OF THE INVENTION

This problem is solved in accordance with this invention by a controller apparatus comprising means responsive to an external frequency signal to change the hysteresis over a few synchronization cycles in order to pull the controller module into synchronization.

More particularly, the controller apparatus comprises reference signal generator means responsive to a command signal for generating a reference signal, the amplitude of which is a function of the command signal, said reference signal having an upper threshold level and a lower threshold level; current sensor means connected to sense said electric current and to generate a sensor signal representing said current; comparator means connected to compare the sensor signal to the reference signal for producing a drive signal for the regulating switch, said drive signal having a first state when the increasing sensor signal is lower than the upper threshold level of the reference signal and a second state when the decreasing sensor signal is greater than the lower threshold level of the reference signal; means for switching the reference signal from one level to the other in response to the drive signal swinging from one state to the other; controllable switching means responsive to a control signal to vary the threshold levels of the reference signal, thereby to vary the switch-on and switch-off times of the first switching means and the regulating switch; and phase-locked loop circuit means comprising phase comparator and low-pass filter means connected to accept a signal representing the switching frequency of the apparatus and an external frequency signal and to produce a control signal for said controllable switching means, said control signal being a function of the phase difference between the input signals thereto.

DESCRIPTION OF AN EXEMPLARY EMBODIMENT

Figure 1:
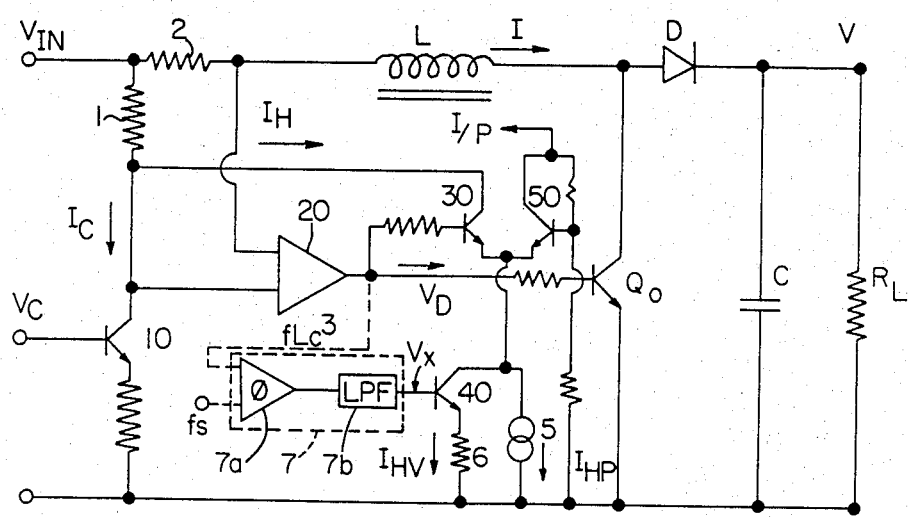
FIG. 1 is a schematic diagram of a basic boost voltage regulator including a controller apparatus in accordance with the invention.

Referring to FIG. 1, there is shown a basic boost voltage regulator comprising, as usual, a controlled regulating switch $Q_o$ connected across a load represented by the resistor $R_L$, an inductor L for energy storage and a diode D with a shunt capacitor C. The resistor 2 forms a sensor device for the inductor current I. The voltage drop $V_2$ produced across the sensor resistor 2 is controlled by a reference voltage $V_1$ produced across resistor 1. For this purpose the reference voltage $V_1$ is applied as a first input to a comparator device 20 and the voltage drop $V_2$ produced across resistor 2 is applied as a second input to the comparator, the output signal of which being the drive signal $V_D$ for the regulating transistor switch Qo. When the sense voltage drop exceeds the reference voltage $V_1$, the drive signal $V_D$ is negative and turns the transistor Qo off.

The drive signal $V_D$ is also applied to the base of transistor 30, the function of which is to provide the hysteresis current switching. The collector electrodes of transistor 30 is connected to said first input of the comparator 20 and its emitter electrode is connected to a current source 5. The transistor 30 is switched ON and OFF concurrently with transistor Qo.

Assuming that the drive signals $V_D$ is positive and hence forces transistors Qo and 30 to conduct, then the inductor current I will increase and the resultant increase of current is monitored by the proportional voltage drop $V_2$ across the sense resistor 2. The reference voltage $V_1$ during this increase in inductor current is determined by the value of resistor 1 and the sum of the control current $I_c$ and the hysteresis current $I_H$, i.e.

$$V_1' = (I_c + I_H) R_1$$

The control current is proportional to the command signal Vc applied to the base of transistor 10. The transistors Qo and 30 continue to conduct until the voltage drop $V_2$ exceeds the momentary value of the reference voltage $V_1$.

When the sense voltage drop $V_2$ in fact exceeds the reference voltage $V_1$, then the drive signal $V_D$ will swing negatively, hence causing the transistors Qo and 30 to be switched off. As a result, the reference voltage $V_1$ is immediately reduced to a lower value $$V_1'' = I_c R_1$$

since the hyteresis current $I_H$ is then shunted by the transistor 30 which is saturated.

The comparator's inputs are thereby reversed since the sense voltage drop $V_2$ cannot change instantaneously due to the current I flowing through the inductor L. Also, since transistor Qo has been switched off, the inductor current I flows through the diode D which results in a decrease of current.

Since, following the switch-off of the transistor Qo, the reference voltage $V_1$ is lower than the voltage drop $V_2$ across the sense resistor 2, the drive signal $V_D$ at the comparator's output will remain negative until the decreasing voltage drop $V_2$ equals the new value of the reference voltage $V_1$.

At this point, the drive signal $V_D$ will once again swing positively and hence force the transistors Qo and 30 to conduct. Instantaneously, the reference voltage $V_1$ will switch to its upper value $V_1'$ due to the effect of the hysteresis current $I_H$ flowing through resistor 1. Then, the inductor current will start to increase as before. For a given control current Ic, i.e. for a given command signal $V_C$, the regulator will continue to oscillate such that the sense resistor voltage drop $V_2$ remains between the limits set by the reference voltage values and such that the inductor current I will oscillate between two limit thresholds.

Figure 2A:
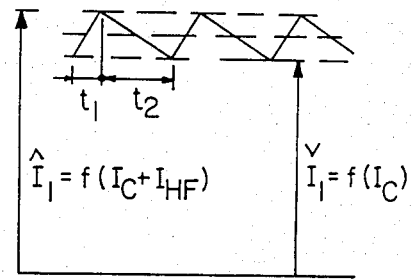
FIGS. 2A and 2B show the inductor current waveform as a function of the hysteresis current control as controlled by the apparatus of the invention.
Figure 2B:
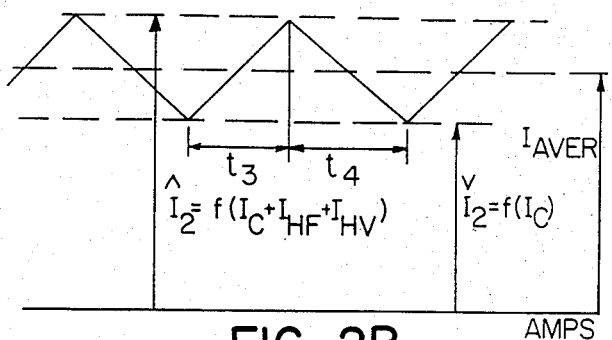

The hysteresis current value can be varied as a function of a control voltage Vx to be applied to the base of transistor 40. It is seen that the hysteresis current $I_H$ is composed of two components: one fixed component $I_{HF}$ set to fix the maximum free-running frequency of the apparatus and one variable component $I_{HV}$ which is generated by the transistor 40 being switched to conduct. The fixed hysteresis component has a value of:

$$I_{HF} = V_{IN}/R_5$$

where $V_{IN}$ is the input voltage and $R_5$ is the resistance of current source 5. The variable hysteresis component has a value of:

$$I_{HV} = (Vx - V_{BE})/R_6$$

where Vx is the control voltage applied to drive transistor 40, $V_{BE}$ is the base-to-emitter voltage of transistor 40 and $R_6$ is the value of resistor 6. The control voltage Vx is produced by a phase locked loop circuit 7 comprising a phase comparator 7a and a low-pass loop filter 7b. The phase comparator 7a is connected to accept as a first input a signal denoted $f_{LC3}$ representing the actual switching frequency of the primary control loop and to accept as a second input an external frequency synchronization signal $f_S$ and to produce a voltage signal proportional to the phase difference between its input signals. Hence, upon application of the desired synchronization signal, the output voltage of the phase comparator, after filtering in the loop filter, say the control voltage Vx, goes positive and forces the transistor 40 to conduct, whereby the variable hysteresis current component $I_{HV}$ is generated. This has the effect of increasing the positive current switching threshold of the regulating transistor Qo and thereby delaying the switch-off of said regulating transistor Qo. This mode of operation is illustrated by the diagram of FIGS. 2A and B Referring to FIGS. 2A and B there is shown the inductor current waveform. The symbols $\hat{I}$ and $\check{I}$ denote the positive current switching threshold and the negative current switching threshold respectively. FIG. 2A of this diagram shows the inductor current waveform oscillating e.g. at its natural switching frequency, i.e. without application of a synchronization signal. The current switching thresholds are $\hat{I}_1$ and $\check{I}_1$. FIG. 2B of the diagram shows the inductor current waveform in response to the hysteresis current being varied upon application of a synchronization signal. When Vx goes positive, the positive current switching threshold $\hat{I}$ increases to a value of $\hat{I}_2 = f(I_C + I_{HF} + I_{HV})$. Consequently, the switch-on time of the regulating transistor Qo increases from the value of $t_1$ to the new value of $t_3$. Similarly, the negative current switching threshold $\check{I}$ decreases to a value of $\check{I}_2$, whereby the switch-off time of transistor Qo increases from the value of $t_2$ to the new value of $t_4$. This dynamic change in hysteresis value results in a compensating change in the primary control loop responding to the command signal Vc in order that the average inductor current remain constant, i.e.:

$$\hat{I}_{IND} = (\check{I}_1 + \hat{I}_1)/2 = (\hat{I}_2 + \check{I}_2)/2$$

The operation frequency of the controller is described by the following equation:

$$f = V_{IN}(1 - V_{IN}/V_0)/L\Delta I$$

where
$V_{IN}$ is the input voltage
$V_0$ is the output voltage

L is the inductance of the inductor
ΔI is the hysteresis current of the inductor, e.g.
$\Delta I = \hat{I} - \check{I}$ in FIG. 2
Using the values for $I_2$ and $\check{I}_2$ of FIG. 2:

$$f = V_{IN}(1 - V_{IN}/V_0)/LK(I_{HF} + I_{HV}) \quad (2)$$

where
$K = R_1/R_2$

The controller can thus be regarded as a voltage-controlled oscillator controlled by said control voltage Vx and whose maximum and minimum tracking frequencies are defined by equation (2) above. That is, the maximum frequency occurs when $I_{HV} = 0$ (transistor 40 switched off) and the minimum frequency occurs when $I_{HV} = V_x(max)/R_6$.

Figure 3:
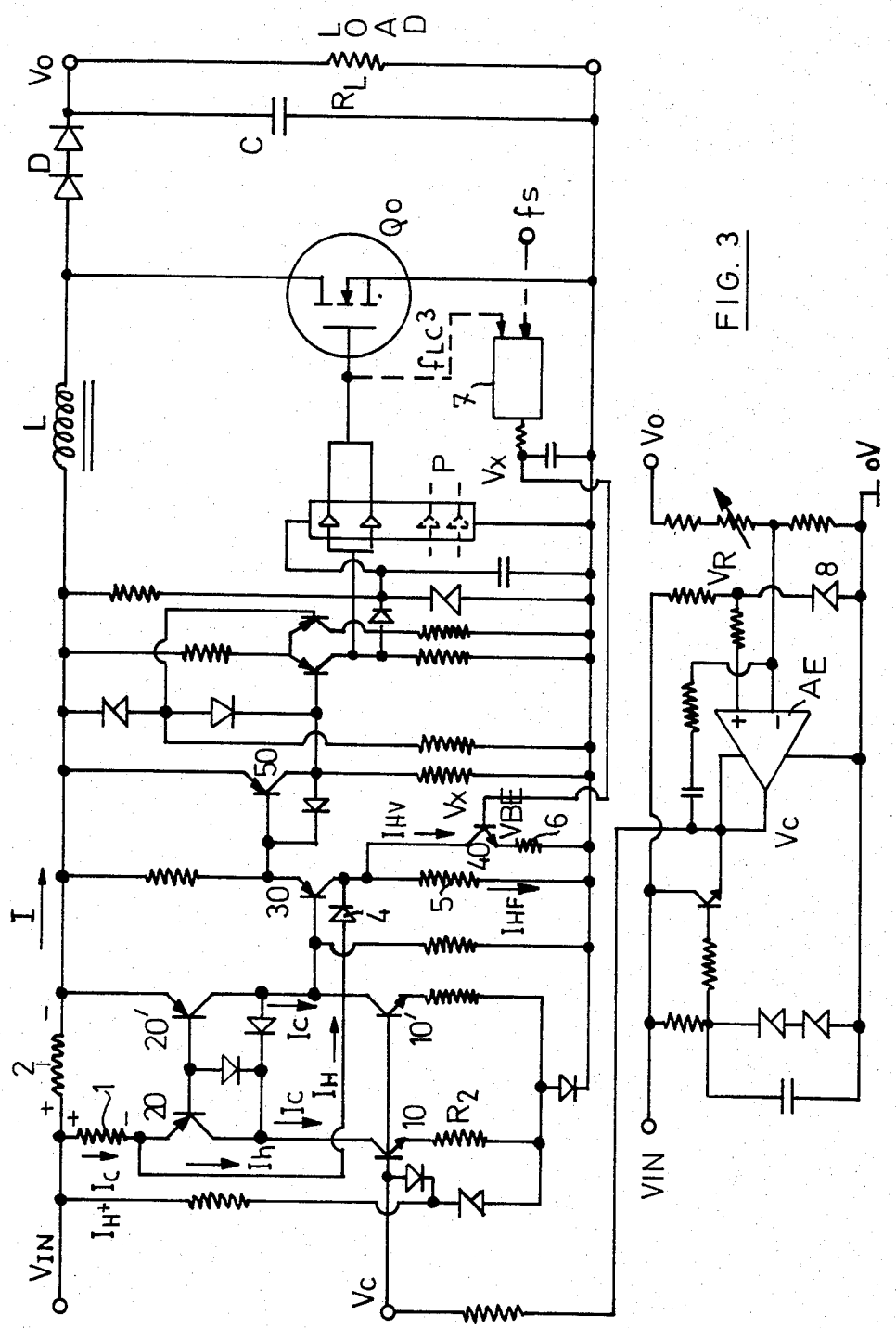
FIG. 3 is a schematic diagram of an exemplary implementation of the apparatus according to the invention.

Referring now to FIG. 3 there is shown an exemplary implementation of the controller apparatus according to this invention in a boost voltage regulator. In this figure the same reference numerals as used in FIG. 1 denote the same or equivalent components. The command signal Vc is produced at the output of an error amplifier $A_E$ which is connected to accept as inputs the output voltage $V_0$ and a predetermined reference voltage $V_R$ set across Zener diode 8. The command signal Vc thereby represents the deviation of the output voltage $V_0$ from the reference voltage $V_R$. The command signal Vc is applied to the base of the transistors 10 and 10' which form the conductance control stage generating the control current Ic. The transistors 20 and 20' form the comparator device for comparing the voltage drop $V_2$ across the sense resistor 2 and the reference voltage drop $V_1$ across resistor 1.

The transistor 30 is the switching means connected to provide the hysteresis switching.. When 30 and hence 50 are OFF, the regulating transistor Qo is switched ON; when 30 and hence 50 are ON, the regulating transistor Qo is switched OFF.

The operation of the transistor 30, and hence 50 and the regulating transistor switch Qo, is controlled as follows:

30 switches ON and Qo turns to OFF when $$\hat{I}R_2 \geq (I_H + I_C)R_1 \quad (3)$$

30 switches OFF and Qo turns to ON when $$\check{I}R_2 \leq I_C R_1 \quad (4)$$

where
$\hat{I}$ is the upper peak inductor current
$\check{I}$ is the lower peak inductor current
$I_C$ is the control current
$I_H$ is the hysteresis current
$R_1$ is the value of resistor 1
$R_2$ is the value of resistor 2

Since the hysteresis current $I_H$ is composed of a fixed component $I_{HF}$ and a variable component $I_{HV}$, it is seen that $$I_{HF} = V_{IN}/R_5$$

$$I_{HV} = (V_x - V_{BE})/R_6$$

where
$V_{IN}$ is the input voltage
$V_x$ is the filtered control voltage at the output of the phase locked loop $V_{BE}$ is the base-to-emitter voltage of 40
$R_5$ is the value of resistor 5
$R_6$ is the value of resistor 6

Hysteresis switching is effected by the transistor 30 switching ON and OFF according to equations (3) and (4). The hysteresis current $I_H$ flows in resistor 1 when 30 is ON and it is shunted ($I_H = 0$) when 30 is saturated.

As described in the foregoing, the variable hysteresis current component $I_{HV}$ is generated upon application of a desired frequency synchronization signal $f_S$ at one input of the phase-locked loop circuit 7, thereby to force transistor 40 to conduct.

Besides the advantages of being capable of operation in a stable manner for duty cycles from zero to 100% with inherent current limitation, the controller apparatus according to the invention allows easy paralleling of several modules feeding the same load as schematically illustrated by the dotted lines labelled P in FIG. 3. All the paralleled modules are then controlled by the same command signal Vc, which permits direct control of power sharing between the modules.

It will be apparent to those skilled in the art that the controller apparatus in accordance with this invention can be implemented in various embodiments departing by several details from the exemplary implementation described in the foregoing and that the controller applies to other regulator types.

What is claimed is:

1. In an apparatus for the control of a switched power regulator including an inductor through which an electric current flows, and a regulating switch arranged for being switched between a first non-conducting logic state and a second conducting logic state in response to a drive signal with a predetermined time elapsing between said first and second logic states, an electric controller operating in a conductance control mode, comprising:

reference signal generator means (1,10) responsive to a command signal (Vc) for generating a reference signal ($V_1$) the amplitude of which is a function of the command signal, said reference signal having an upper threshold level and a lower threshold level;

current sensor means (2) connected to sense said electric current (I) and to generate a sensor signal ($V_2$) representing said current;

comparator means (20) connected to compare the sensor signal to the reference signal for producing said drive signal for the regulating switch (Qo), said drive signal ($V_D$) having a first state when the increasing sensor signal is lower than the upper threshold level of the reference signal and a second state when the decreasing sensor signal is greater than the lower threshold level of the reference signal;

means (30) for switching the reference signal from one level to the other in response to the drive signal swinging from one state to the other;

controllable switching means (40) responsive to a control signal (Vx) to vary the threshold levels of the reference signal, thereby to vary the time elapsing between said first and second logic states of the regulating switch;

phase-locked loop circuit means (7) comprising phase comparator and low-pass filter means connected to accept a signal ($f_{LC3}$) representing the switching frequency of the apparatus and an external frequency signal ($f_S$) and to produce a control signal (Vx) for said controllable switching means (40), said control signal being a function of the phase difference between the input signals thereto.

2. Apparatus according to claim 1, wherein the controllable switching means (40) is a switch connected in series with the means (30) for switching the reference signal, and having a control input for accepting said control signal (Vx).

* * * * *